(12) United States Patent
Hao et al.

(10) Patent No.: US 11,881,536 B2
(45) Date of Patent: Jan. 23, 2024

(54) ADAMANTINE SEMICONDUCTOR AND USES THEREOF

(71) Applicant: NewSouth Innovations Pty Limited, Sydney (AU)

(72) Inventors: Xiaojing Hao, Sydney (AU); Robert John Patterson, Sydney (AU); Shiyou Chen, Sydney (AU); Martin Andrew Green, Sydney (AU)

(73) Assignee: NewSouth Innovations Pty Limited, Sydney (AU)

( * ) Notice: Subject to any disclaimer, the term of this patent is extended or adjusted under 35 U.S.C. 154(b) by 187 days.

(21) Appl. No.: 16/959,654

(22) PCT Filed: Feb. 15, 2019

(86) PCT No.: PCT/AU2019/050121
§ 371 (c)(1),
(2) Date: Jul. 1, 2020

(87) PCT Pub. No.: WO2019/157562
PCT Pub. Date: Aug. 22, 2019

(65) Prior Publication Data
US 2021/0135028 A1 May 6, 2021

(30) Foreign Application Priority Data

Feb. 16, 2018 (AU) ................................ 2018900501

(51) Int. Cl.
*H01L 31/18* (2006.01)
*H01L 31/0749* (2012.01)
(Continued)

(52) U.S. Cl.
CPC .......... *H01L 31/18* (2013.01); *H01L 31/0296* (2013.01); *H01L 31/02966* (2013.01);
(Continued)

(58) Field of Classification Search
CPC ........... H01L 31/0296; H01L 31/02966; H01L 31/0304; H01L 31/03046; H01L 31/0322; H01L 31/0324; H01L 31/0749
See application file for complete search history.

(56) References Cited

U.S. PATENT DOCUMENTS

2006/0124833 A1* 6/2006 Toda ................. H01L 27/14685
250/214 R
2010/0190292 A1   7/2010 Alberts
(Continued)

FOREIGN PATENT DOCUMENTS

CN          105932111 A       9/2016

OTHER PUBLICATIONS

Song, Xiangbo, et al., "A Review on Development Prospect of CZTS Based Thin Film Solar Cells", Hindawi Publishing Corporation, International Journal of Photoenergy, vol. 2014, Article ID 613173, 11 pgs.; http://dx.doi.org/10.1155/2014/613173.
(Continued)

*Primary Examiner* — Golam Mowla
(74) *Attorney, Agent, or Firm* — GREENBERG TRAURIG, LLP

(57) ABSTRACT

Disclosed is an adamantine semiconductor. The semiconductor comprises a first element being from one of the following groups: VIII, VII, VI, V, IV, III, II, I or 0. The semiconductor also comprises at least two other elements, the at least two other elements being from group I, II, III, IV, V, VI and/or VII. The first element being from group VIII, VII, VI, V, IV, III, II, I or 0 includes an element not formally being from group VIII, VII, VI, V, IV, III, II, I or 0 but is known to assume the same oxidation state as the elements that do lie in these groups. The at least two other elements from group I, II, III, IV, V, VI and/or VII includes elements not formally being from group I, II, III, IV, V, VI and/or VII but are known to assume the same oxidation state as the elements that do lie in these groups.

15 Claims, 3 Drawing Sheets

(51) Int. Cl.
*H01L 31/0296* (2006.01)
*H01L 31/0304* (2006.01)
*H01L 31/032* (2006.01)

(52) U.S. Cl.
CPC ...... *H01L 31/0304* (2013.01); *H01L 31/0322* (2013.01); *H01L 31/0324* (2013.01); *H01L 31/03046* (2013.01); *H01L 31/0749* (2013.01); *Y02E 10/541* (2013.01)

(56) References Cited

U.S. PATENT DOCUMENTS

| | | | | |
|---|---|---|---|---|
| 2010/0282320 | A1* | 11/2010 | Meyers | H01L 31/02966 438/94 |
| 2014/0338736 | A1* | 11/2014 | Yun | H01L 21/02568 438/94 |
| 2016/0027938 | A1* | 1/2016 | Stoica | H01L 21/02439 257/190 |

OTHER PUBLICATIONS

Walsh, Aron, et al., "Kesterite Thin-Film Solar Cells: Advances in Materials Modelling of Cu2ZnSnS4", wileyonlinelibrary.com, Adv. Energy Mater. 2012, 2, pp. 400-409.

* cited by examiner

US 11,881,536 B2

ADAMANTINE SEMICONDUCTOR AND USES THEREOF

TECHNICAL FIELD

This disclosure relates generally to adamantine semiconductor materials for use, for example, in solar cells.

BACKGROUND

Improved efficiency has been an important contributor to recently reduced photovoltaic costs. This is a key reason why industry is transitioning to the manufacturing of higher performance cells. This transition is expected to be completed between 2022-2027, with commercial cell efficiency then approaching 25%.

To mitigate climate change impacts, photovoltaics need to reach annual installation levels approaching 1 TW/year, about 10 times higher than in 2017. Moreover, it needs to do this quickly, well before 2030, if global temperature rise is to be constrained to <2° C. What is urgently needed for photovoltaics to make its full potential impact is a higher performance, lower cost photovoltaic technology, ideally ready for market by the time the efficiency gains from the transition to current high performance cells are exhausted, to continue both cost reduction due to progress along the learning curve and the ever-increasing demand this creates.

One way to achieve higher efficiency is to stack solar cells with different bandgaps on top of one another. In terms of performance, top cell efficiency over 20% is required. Although >10,000 different semiconductors are known, only 7 have demonstrated an efficiency >20% (Si, GaAs, InP, GaInP, CIGS, CdTe and Pb-halide perovskites) in use as a solar cell. Six of these 7 are "closed-shell, adamantine (diamond-like)" semiconductors, despite these representing only a small fraction (<1%) of available semiconductors. Further, the semiconductors that are currently used for photovoltaics generally use elements that are not abundant and/or are toxic. For example, of the 7 semiconductors that have demonstrated efficiencies >20%, only Si is stable, abundant and nontoxic.

It is to be understood that, if any prior art publication is referred to herein, such reference does not constitute an admission that the publication forms a part of the common general knowledge in the art, in Australia or any other country.

SUMMARY

Disclosed is an adamantine semiconductor comprising a group 0B element and at least two other elements, the at least two other elements being from group I, II, III, IV, V, VI and/or VII, wherein the at least two other elements from group I, II, III, IV, V, VI and/or VII includes elements not formally lying in (i.e. being from) group I, II, III, IV, V, VI and/or VII but are known to assume the same oxidation state as the elements that do lie in these groups. The semiconductor may have a structure in accordance with at least one of the following families: $0\text{-II-VII}_2$, $0_2\text{-III-VII}_3$, $0_3\text{-IV-VII}_4$, $0\text{-IV-VI}_2$, $0\text{-III}_2\text{-VI}_3$, $0\text{-IV}_3\text{-V}_4$, $0\text{-I-II-VII}_3$, $0\text{-I}_2\text{-II-VII}_4$, $0_2\text{-I-III-VII}_4$, $0\text{-I-V-VI}_3$, $0\text{-I-IV-VI}_3$, $0\text{-II-III}_2\text{-VI}_4$, $0\text{-II}_2\text{-IV-VI}_4$, $0\text{-I-II-V-VI}_4$ and/or $0\text{-I-III-IV-VI}_4$.

Also disclosed is an adamantine semiconductor comprising a group 0B element and having a structure in accordance with at least one of the following families: $0\text{-II-VII}_2$, $0_2\text{-III-VII}_3$, $0_2\text{-IV-VII}_4$, $0\text{-IV-VI}_2$, $0\text{-III}_2\text{-VI}_3$, $0\text{-I-II-VII}_3$, $0\text{-I}_2\text{-II-VII}_4$, $0_2\text{-I-III-VII}_4$, $0\text{-I-V-VI}_3$, $0\text{-II-IV-VI}_3$, $0\text{-II-III}_2\text{-VI}_4$, $0\text{-II}_2\text{-IV-VI}_4$, $0\text{-I-II-V-VI}_4$ and $0\text{-I-III-IV-VI}_4$.

Also disclosed is an adamantine semiconductor comprising:

a first element being from one of the following groups: $\overline{\text{VIII}}$, $\overline{\text{VII}}$, $\overline{\text{VI}}$, $\overline{\text{V}}$, $\overline{\text{IV}}$, III, II, I or 0; and at least two other elements, the at least two other elements being from group I, II, III, IV, V, VI and/or VII;

wherein the first element being from group $\overline{\text{VIII}}$, $\overline{\text{VII}}$, $\overline{\text{VI}}$, $\overline{\text{V}}$, $\overline{\text{IV}}$, III, II, I or 0 includes an element not formally being from group VIII, VII, VI, V, IV, III, II, I or 0 but is known to assume the same oxidation state as the elements that do lie in these groups; and wherein the at least two other elements from group I, II, III, IV, V, VI and/or VII includes elements not formally being form group I, II, III, IV, V, VI and/or VII but are known to assume the same oxidation state as the elements that do lie in these groups.

The term "group 0B" is to be interpreted broadly to mean any element being in Group 10 (also known as Group VIII according to old IUPAC number or VIIIB according to CAS numbering) and includes Ni, Pd, Pt and/or Ds. The term "groups $\overline{\text{VIII}}$, $\overline{\text{VII}}$, $\overline{\text{VI}}$, $\overline{\text{V}}$, $\overline{\text{IV}}$, III, II, I or 0" is also to be interpreted broadly to mean any element being in, respectively, group 2, 3, 4, 5, 6, 7, 8, 9 or 10 (also known as IIA, IIIA, IVA, VA, VIA, VIIA, VIII according to old IUPAC numbering or IIA, IIIB, IVB, VB, VIB, VIIB, VIIIB according to CAS numbering), and "group I, II, III, IV, V, VI and/or VII" is to be interpreted broadly to mean any element being in, respectively, group 11, 12, 13, 14, 15, 16 or 17 (also known as IB, IIB, IIIB, IVB, VB, VIB, VIIB according to old IUPAC numbering or IB, IIB, IIIA, IVA, VA, VIA and VIIA according to CAS numbering). More generally, the term can also refer to elements not formally being from the indicated group(s) but are known to commonly assume the same oxidation state as the elements that do lie in that group. For example, the non-adamantine, perovskite semiconductor, $CsPbI_3$, would be commonly referred to as a Group I-II-VII$_3$ compound even though Pb is a Group IV (Group 14) element, rather than a Group II (Group 12) element. Group 1 and Group 2 elements usually assume oxidation states the same as Group 11 and 12 elements and are explicitly included in the Group I and Group II terminology, particularly for the more electronegative elements.

The semiconductor may have a closed-shell structure with an equivalent number of cations and anions. Each anion may be surrounded by a same combination of cations. A bandgap of the semiconductor may range from about 0.6 eV to about 2.1 eV. The semiconductor may have a low-lying d-state giving rise to an anti-bonding valence band edge. The semiconductor may be substantially free from toxic elements including Cd, Pb and Hg.

The first element may have a zero oxidation state.

The semiconductor may have a structure that belongs to a ternary, quaternary or quinternary family. The structure of the ternary family may include $0\text{-II-VII}_2$, $\overline{\text{I}}\text{-III-VII}_2$, $\overline{\text{II}}\text{-IV-VII}_2$, $\overline{\text{III}}\text{-V-VII}_2$, $\overline{\text{IV}}\text{-VI-VII}_2$, $(0_2\text{-III-VII}_3)$, $(\overline{\text{I}}_2\text{V-VII}_3)$, $(\overline{\text{I}}\text{-II}_2\text{-VII}_3)$, $(\overline{\text{III}}\text{-III}_2\text{-VII}_3)$, $(\overline{\text{V}}\text{-IV}_2\text{-VII}_3)$, $(\overline{\text{VII}}\text{-V}_2\text{-VII}_3)$, $0_3\text{-IV-VII}_4$, $\overline{\text{II}}\text{-II}_3\text{-VII}_4$, $\overline{\text{V}}\text{-III}_3\text{-VII}_4$, $0\text{-IV-VI}_2$, $\overline{\text{I}}\text{-V-VI}_2$, $(0\text{-III}_2\text{-VI}_3)$, $(\overline{\text{II}}\text{-IV}_2\text{-VI}_3)$, $(\overline{\text{IV}}\text{-V}_2\text{-VI}_3)$ $\overline{\text{I}}\text{-III}_3\text{-VI}_4$, $\overline{\text{IV}}\text{-IV}_3\text{-VI}_4$, $\overline{\text{VII}}\text{-V}_3\text{-VI}_4$, $0\text{-IV}_3\text{-V}_4$. The structure of the quanternary family may include $(0\text{-I-II-VII}_3)$, $(\overline{\text{I}}\text{-I-III-VII}_3)$, $(\overline{\text{II}}\text{-I-IV-VII}_3)$, $(\overline{\text{III}}\text{-II-V-VII}_3)$, $(\overline{\text{IV}}\text{-I-VI-VII}_3)$, $(\overline{\text{II}}\text{-II-III-VII}_3)$, $(\overline{\text{III}}\text{-II-IV-VII}_3)$, $(\overline{\text{IV}}\text{-II-V-VII}_3)$, $(\overline{\text{IV}}\text{-III-IV-VII}_3)$, $(\overline{\text{V}}\text{-II-VI-VII}_3)$, $(\text{V-III-V-VII}_3)$, $(\text{VI-III-VI-VII}_3)$, $(\text{VI-IV-V-VII}_3)$, $\text{VII-IV-VI-VII}_3)$, $(\overline{\text{VIII}}\text{-V-VI-VII}_3)$, $0\text{-I}_2\text{-II-VII}_4$, $0_2\text{-I-III-VII}_4$, $\overline{\text{I}}\text{-I}_2\text{-III-VII}_4$, $\overline{\text{I}}_2\text{-I-V-VII}_4$, $\overline{\text{I}}\text{-I-II}_2\text{-VII}_4$, $I_2$-II-IV-$VII_4$, $II-I_2$-IV-$VII_4$, $II_2$-II-VI-$VII_4$, $II_2$-III-V-$VII_4$, $\overline{III}$-$I_2$-V-$VII_4$, $\overline{III}$-$II_2$-III-$VII_4$, $\overline{III}_2$-IV-VI-$VII_4$, $\overline{III}$-I-$III_2$-$VII_4$, $\overline{IV}$-$I_2$-VI-$VII_4$, $\overline{IV}$-$II_2$-V-$VII_4$, $\overline{IV}$-II-$III_2$-$VII_4$, $\overline{V}$-$II_2$-V-$VII_4$, $\overline{V}$-I-$IV_2$-$VII_4$, $\overline{VI}$-$III_2$-IV-$VII_4$, $\overline{VI}$-$II_2$-VI-$VII_4$, $\overline{VII}$-I-$V_2$-$VII_4$, $\overline{VII}$-III-$IV_2$-$VII_4$, $\overline{VII}$-I-$V_2$-$VII_4$, $\overline{VIII}$-II-$V_2$-$VII_4$, $\overline{VIII}$-$III_2$-VI-$VII_4$, (0-I-V-$VI_3$), (0-II-IV-$VI_3$), ($\overline{I}$-III-IV-$VI_3$), ($\overline{I}$-II-V-$VI_3$), ($\overline{II}$-III-V-$VI_3$), ($\overline{III}$-IV-V-$VI_3$), 0-II-$III_2$-$VI_4$, 0-$II_2$-IV-$VI_4$, $\overline{I}$-$II_2$-V-$VI_4$, $\overline{I}$-I-$IV_2$-$VI_4$, $\overline{II}$-II-IV-$VI_4$, $\overline{II}$-$III_2$-IV-$VI_4$, $\overline{III}$-III-$IV_2$-$VI_4$, $\overline{III}$-$III_2$-V-$VI_4$, $\overline{VI}$-III-$V_2$-$VI_4$, $\overline{VI}$-IV-$V_2$-$VI_4$. The structure of the quinternary family may include $\overline{I}$-II-III-IV-$VI_4$, $\overline{III}$-II-III-$VII_4$, $\overline{III}$-I-II-IV-$VII_4$, $\overline{IV}$-I-III-IV-$VII_4$, $\overline{IV}$-I-II-V-$VII_4$, $\overline{V}$-I-II-VI-$VII_4$, $\overline{V}$-I-III-V-$VII_4$, $\overline{V}$-II-III-IV-$VII_4$, $\overline{VI}$-I-IV-V-$VII_4$, $\overline{VI}$-II-III-V-$VII_4$, $\overline{VII}$-II-IV-V-$VII_4$, $\overline{VIII}$-III-IV-V-VII.

In an embodiment, $\overline{VIII}$ includes Ca, Sr, Ba; $\overline{VII}$ includes La; $\overline{VI}$ includes Ti, Zr, Hf; $\overline{V}$ includes V, Nb, Ta; $\overline{IV}$ includes Cr, Mo, W; $\overline{III}$ includes Mn; $\overline{II}$ includes Fe; $\overline{I}$ includes Co; 0 includes Ni; I includes Cu, Ag; II includes Mg, Zn; III include B, Al, Ga; IV includes C, Si, Sn; V includes N, P, Bi; VI includes O, S; VII includes F, Cl, Br, I.

The semiconductor may include at least one of the elements Cu, Mg, Zn, Al, Si, Bi, P, S, I, Br, Cl and Se. The semiconductor may have a formula of $NiSiS_2$, $NiZnI_2$, $NiSi_3P_4$, $NiZnInS_4$, $NiZnAlS_4$, $NiCuAlSnS_4$, $NiCuAlSiS_4$. $NiSiS_2$ is an example of a 0-IV-$VI_2$ ternary adamantine semiconductor. The band gap may be determined using ab initio simulations.

Also disclosed is a method of forming an adamantine semiconductor, comprising:

providing a mixture including a group 0B element and at least two other elements, the at least two other elements bring from group I, II, III, IV, V, VI and/or VII, wherein the at least two elements from group I, II, III, IV, V, VI and/or VII includes elements not formally lying in group I, II, III, IV, V, VI and/or VII but are known to assume the same oxidation state as the elements that do lie in these groups; and annealing the mixture to form the semiconductor.

Also disclosed is a method of forming an adamantine semiconductor, comprising:

providing a mixture including:

a first element being from one of the following groups: $\overline{VIII}$, $\overline{VII}$, $\overline{VI}$, $\overline{V}$, $\overline{IV}$, $\overline{III}$, $\overline{II}$, $\overline{I}$ or 0; and at least two other elements, the least two other elements being from group I, II, III, IV, V, VI and/or VII;

wherein the first element being from group $\overline{VIII}$, $\overline{VII}$, $\overline{VI}$, $\overline{V}$, $\overline{IV}$, $\overline{III}$, $\overline{II}$, $\overline{I}$ or 0 includes an element not formally being from group $\overline{VIII}$, $\overline{VII}$, $\overline{VI}$, $\overline{V}$, $\overline{IV}$, $\overline{III}$, $\overline{II}$, $\overline{I}$ or 0 but is known to assume the same oxidation state as the elements that do lie in these groups; and wherein the at least two other elements from group I, II, III, IV, V, VI and/or VII includes elements not formally being form in group I, II, III, IV, V, VI and/or VII but are known to assume the same oxidation state as the elements that do lie in these groups;

the method further comprising annealing the mixture to form the semiconductor.

The semiconductor may have a structure as set forth above. The semiconductor may include elements as set forth above. The semiconductor may have a structure in accordance with at least one of the following families: 0-II-$VII_2$, $0_2$-III-$VII_3$, $0_3$-IV-$VII_4$, 0-IV-$VI_2$, 0-$III_2$-$VI_3$, 0-$IV_3$-$V_4$, 0-I-II-$VII_3$, 0-$I_2$-II-$VII_4$, $0_2$-I-III-$VII_4$, 0-I-V-$VI_3$, 0-I-III-IV-$VI_3$, 0-II-$III_2$-$VI_4$, 0-$II_2$-IV-$VI_4$, 0-I-II-V-$VI_4$ and 0-I-III-IV-$VI_4$. The group 0 (or 0B) element may include Ni and the I, II, III, IV, V, VI and/or VII elements may include Cu, Mg, Zn, Al, Si, Bi, P, S, I, Br, Cl and/or Se. For example, the mixture may include Ni, Si and S to form a semiconductor having a formula of $NiSiS_2$. The first element and the at least two other elements may each be provided as a powder, gas, salt and/or solution.

The disclosure also provides an adamantine semiconductor formed using the method as set forth above.

Also disclosed is a photovoltaic element comprising:

a substrate; and first layer having an adamantine semiconductor comprising a group 0B element and at least two other elements, the at least two other elements bring from group I, II, III, IV, V, VI and/or VII, wherein the at least two elements from group I, II, III, IV, V, VI and/or VII includes elements not formally lying in group I, II, III, IV, V, VI and/or VII but are known to assume the same oxidation state as the elements that do lie in these groups.

Also disclosed is a photovoltaic element comprising:

a substrate; and a first layer having an adamantine semiconductor comprising:

a first element being from one of the following groups: $\overline{VIII}$, $\overline{VII}$, $\overline{VI}$, $\overline{V}$, $\overline{IV}$, $\overline{III}$, $\overline{II}$, $\overline{I}$ or 0; and at least two other elements, the at least two other elements being from group I, II, III, IV, V, VI and/or VII, wherein the first element being from group $\overline{VIII}$, $\overline{VII}$, $\overline{VI}$, $\overline{V}$, $\overline{IV}$, $\overline{III}$, $\overline{II}$, $\overline{I}$ or 0 includes an element not formally being from group $\overline{VIII}$, $\overline{VII}$, $\overline{VI}$, $\overline{V}$, $\overline{IV}$, $\overline{III}$, $\overline{II}$, $\overline{I}$ or 0 but is known to assume the same oxidation state as the elements that do lie in these groups; and wherein the at least two other elements from group I, II, III, IV, V, VI and/or VII includes elements not formally being from group I, II, III, IV, V, VI and/or VII but are known to assume the same oxidation state as the elements that do lie in these groups.

The substrate may be photovoltaically active. For example, in some embodiments the substrate is configured to be photovoltaically active. The photovoltaic element may further comprise a second or more layers so that the photovoltaic element is a stacked element. The first and second or more layers may be arranged so that a bandgap of each layer decreases in a direction extending from a photo receiving surface to the substrate. An efficiency of the element in use may be >25%. An efficiency for the entire stack may be >35%. The adamantine semiconductor may as otherwise be defined as set forth above.

Also disclosed is a method of forming a photovoltaic element, comprising:

providing a substrate; and depositing a first solar cell structure on the substrate, the first solar cell structure having an adamantine semiconductor comprising a group 0B element and at least two other elements, the at least two other elements being from group I, II, III, IV, V, VI and/or VII, wherein the at least two elements from group I, II, III, IV, V, VI and/or VII includes elements not formally lying in group I, II, III, IV, V, VI and/or VII but are known to assume the same oxidation state as the elements that do lie in these groups.

Also disclosed is a method of forming a photovoltaic device, comprising:

providing a substrate; and depositing a first solar cell structure on the substrate, the first solar cell structure having an adamantine semiconductor comprising:

a first element being from one of the following groups: VIII, VII, VI, V, IV, III, II, I or 0; and at least two other elements being from group I, II, III, IV, V, VI and/or VII, wherein the first element being from VIII, VII, VI, V, IV, III, II, I or 0 includes an element not formally being from group VIII, VII, VI, V, IV, III, II, I or 0 but is known to assume the same oxidation state as the elements that do lie in these groups; and wherein the at least two other elements being from group I, II, III, IV, V, VI and/or VII includes elements not formally lying in group I, II, III, IV, V, VI and/or VII but are known to assume the same oxidation state as the elements that do lie in these groups.

The substrate may be photovoltaically active. The method may further comprise depositing a second or more solar cell structures to form a stacked solar cell. The first and second or more solar cell structures may be deposited in such a way that a bandgap of each solar cell structure in the stack decreases in a direction extending from a photo receiving surface to the substrate. The adamantine semiconductor may as otherwise be defined as set forth above.

BRIEF DESCRIPTION OF FIGURES

Embodiments will now be described by way of example only with reference to the accompanying non-limiting figures.

DETAILED DESCRIPTION OF EMBODIMENTS

Figure 1:
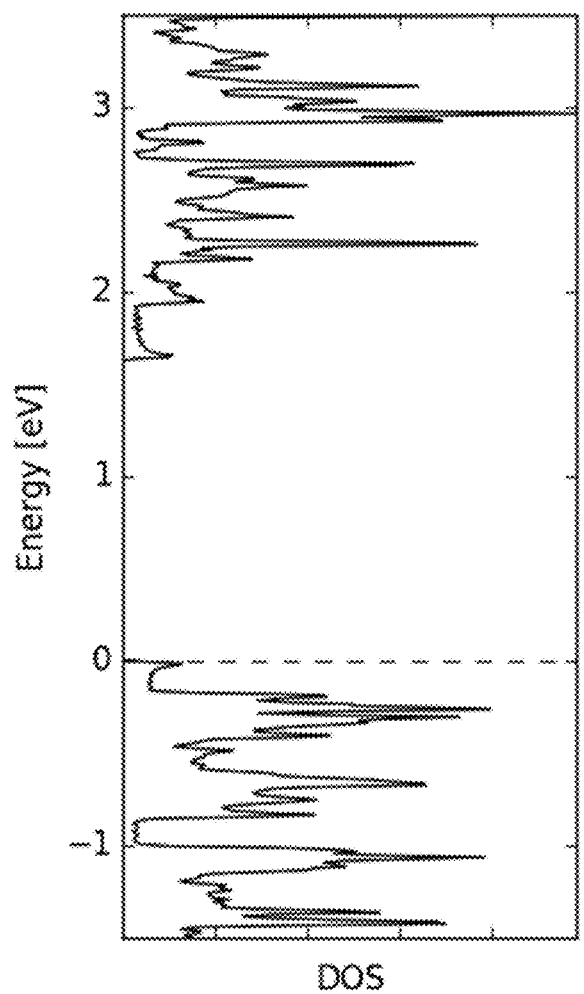
FIG. 1 shows a plot of total states of density (DOF) for $CoZnAlSiS_4$.

The disclosure provides an adamantine semiconductor comprising first element being from one of the following groups: VIII, VII, VI, V, IV, III, II, I or 0. For example, in an embodiment, the semiconductor comprises a group 0B element, such as Ni. The semiconductor also comprises at least two other elements being from group I, II, III, IV, V, VI and/or VII. The first element being from group VIII, VII, VI, V, IV, III, II, I or 0 includes an element not formally being from group VIII, VII, VI, V, IV, III, II, I or 0 but is known to assume the same oxidation state as the elements that do lie in these groups. The at least two other elements from group I, II, III, IV, V, VI and/or VII includes elements not formally being from group I, II, III, IV, V, VI and/or VII but are known to assume the same oxidation state as the elements that do lie in these groups. The semiconductor may have structure in accordance with a ternary, quaternary or quinternary family.

In some embodiments, the structure for the ternary family includes $0\text{-II-VII}_2$, $\text{I-III-VII}_2$, $\text{II-IV-VII}_2$, $\text{III-V-VII}_2$, $\text{IV-VI-VII}_2$, $(0_2\text{-III-VII}_3)$, $(\text{I}_2\text{-V-VII}_3)$, $(\text{I-II-III}_2\text{-VII}_3)$, $(\text{III-III}_2\text{-VII}_3)$, $(\text{V-IV}_2\text{-VII}_3)$, $(\text{VII-V}_2\text{-VII}_3)$, $0_3\text{-IV-VII}_4$, $\text{II-II}_3\text{-VII}_4$, $\text{V-III}_3\text{-VII}_4$, $0\text{-IV-VI}_2$, $\text{I-V-VI}_2$, $(0\text{-III}_2\text{-VI}_3)$, $(\text{II-IV}_2\text{-VI}_3)$, $(\text{IV-V}_2\text{-VI}_3)$, $\text{I-III}_3\text{-VI}_4$, $\text{IV-IV}_3\text{-VI}_4$, $\text{VII-V}_3\text{-VI}_4$, $0\text{-IV}_3\text{-V}_4$. In some embodiments the structure for the quanternary family includes $(0\text{-I-II-VII}_3)$, $(\text{I-I-III-VII}_3)$, $(\text{II-I-IV-VII}_3)$, $(\text{III-I-V-VII}_3)$, $(\text{IV-I-VI-VII}_3)$, $(\text{II-II-III-VII}_3)$, $(\text{III-II-IV-VII}_3)$, $(\text{IV-II-V-VII}_3)$, $(\text{IV-III-IV-VII}_3)$, $(\text{V-II-VI-VII}_3)$, $(\text{V-III-V-VII}_3)$, $(\text{VI-III-VI-VII}_3)$, $(\text{VI-IV-V-VII}_3)$, $(\text{VII-IV-VI-VII}_3)$, $(\text{VIII-V-VI-VII}_3)$ $0\text{-I}_2\text{-II-VII}_4$, $0_2\text{-I-III-VII}_4$, $\text{I-I}_2\text{-III-VII}_4$, $\text{I}_2\text{-I-V-VII}_4$, $\text{I-I-II}_2\text{-VII}_4$, $\text{I}_2\text{-II-IV-VII}_4$, $\text{II-I}_2\text{-IV-VII}_4$, $\text{II}_2\text{-II-VI-VII}_4$, $\text{II}_2\text{-III-V-VII}_4$, $\text{III-I}_2\text{-V-VII}_4$, $\text{III-II}_2\text{-III-VII}_4$, $\text{III}_2\text{-IV-VI-VII}_4$, $\text{III-II-III}_2\text{VII}_4$, $\text{IV-I}_2\text{-VI-VII}_4$, $\text{IV-II}_2\text{-IV-VII}_4$, $\text{IV-II-III}_2\text{VII}_4$, $\text{V-II}_2\text{-V-VII}_4$, $\text{V-I-IV}_2\text{-VII}_4$, $\text{VI-III}_2\text{-IV-VII}_4\text{VI-VI-VII}_4$, $\text{VII-I-V}_2\text{-VII}_4$, $\text{VII-III-IV}_2\text{-VII}_4$ $\text{VII-I-V}_2\text{-VII}_4$, $\text{VIII-II-V}_2\text{-VII}_4$, $\text{VIII-III}_2\text{-VI-VII}_4$, $(0\text{-I-V-VI}_3)$, $(0\text{-II-IV-VI}_3)$, $(\text{I-III-IV-VI}_3)$, $(\text{I-II-V-VI}_3)$, $(\text{II-III-V-VI}_3)$, $(\text{III-IV-V-VI}_3)$, $0\text{-II-III}_2\text{-VI}_4$, $0\text{-II}_2\text{-IV-VI}_4$, $\text{I-II}_2\text{-V-VI}_4$, $\text{I-I-IV}_2\text{-VI}_4$, $\text{II-II-IV-VI}_4$, $\text{II-III}_2\text{-IV-VI}_4$, $\text{III-III-IV}_2\text{-VI}_4$, $\text{III-III}_2\text{-V-VI}_4$, $\text{VI-III-V}_2\text{-VI}_4$, $\text{VI-IV-V}_2\text{-VI}_4$. In some embodiments, the structure for the quinternary family includes $\text{I-II-III-IV-VI}_4$, $\text{II-I-II-III-VII}_4$, $\text{III-I-II-IV-VII}_4$, $\text{IV-I-III-IV-VII}_4$, $\text{IV-I-II-V-VII}_4$, $\text{V-I-II-VI-VII}_4$, $\text{V-I-III-V-VII}_4$, $\text{V-II-III-IV-VII}_4$, $\text{VI-I-IV-V-VII}_4$, $\text{VIII-III-V-VII}_4$, $\text{VII-II-IV-V-VII}_4$, $\text{VIII-III-IV-V-VII}$.

In some embodiments, the semiconductor has a structure in accordance with at least one of the following families: $0\text{-II-VII}_2$, $0_2\text{-III-VII}_3$, $0_3\text{-IV-VII}_4$, $0\text{-IV-VI}_2$, $0\text{-III}_2\text{-VI}_3$, $0\text{-IV}_3\text{-V}_4$, $0\text{-I-II-VII}_3$, $0\text{-I}_2\text{-II-VII}_4$, $0\text{-I-III-VII}_4$, $0\text{-I-V-VI}_3$, $0\text{-II-IV-VI}_3$, $0\text{-II-III}_2\text{-VI}_4$, $0\text{-II}_2\text{-IV-VI}_4$, $0\text{-I-II-V-VI}_4$ and/or $0\text{-I-III-IV-VI}_4$. The semiconductor may have an element from at least two of group I, II, III, IV, V, VI and/or VII. Also disclosed is an adamantine semiconductor comprising a group 0B element and having a structure in accordance with at least one of the following families: $0\text{-II-VII}_2$, $0_2\text{-III-VII}_3$, $0_2\text{-IV-VII}_4$, $0\text{-IV-VI}_2$, $0\text{-III}_2\text{-VI}_3$, $0\text{-IV}_3\text{-V}_4$, $0\text{-I-II-VII}_3$, $0\text{-I}_2\text{-II-VII}_4$, $0_2\text{-I-III-VII}_4$, $0\text{-I-V-VI}_3$, $0\text{-II-IV-VI}_3$, $0\text{-II-III}_2\text{-VI}_4$, $0\text{-II}_2\text{-IV-VI}_4$, $0\text{-I-II-V-VI}_4$ and $0\text{-I-III-IV-VI}_4$.

The tertiary, quaternary and quinternary families mentioned above are new. Further, quinternary families having an adamantine structure were not previously known. The disclosed tertiary, quanternary and quinternary structures significantly increases the previously known families of adamantine semiconductors, and this may allow the development of new semiconductor materials that give rise to e.g. photovoltaic solar cells that have higher efficiencies than those currently known using low-cost, abundant materials.

Elements from group VII, VI, V, IV, III, II, I or 0 are rarely used in already known semiconductors since their ability to form adamantine semiconductors was not previously recognised. However, an advantage of using the elements from group VII, VI, V, IV, III, II, I or 0 such as Ca, Sr, Ba, La, Ti, Zr, Hf, V, Nb, Ta, Cr, Mo, W, Mn, Fe, Co and Ni, is that they tend to be more abundant than traditional elements used in semiconductors, such as Te, In, Se, especially for Ni which is in abundant supply. Further, the disclosed tertiary, quaternary and quinternary families may have suitable characteristics that allow elements from group VII, VI, V, IV, III, II, I or 0 such as Ca, Sr, Ba, La, Ti, Zr, Hf, V, Nb, Ta, Cr, Mo, W, Mn, Fe, Co and Ni be used for semiconductors that are suitable for solar cell elements. In some embodiments, group 0 includes Pd and Pt.

Another advantage of elements from group VII, VI, V, IV, III, II, I or 0 is that they are relatively benign i.e. they are generally considered non-toxic. In an embodiment, the semiconductor does not include toxic elements including Cd, Pb and Hg. This may be advantageous since the number of materials captured in the Restriction of Hazardous Substances Directive (RoHS) legislation has been growing, a trend expected to continue, with new entries selected from materials already identified as hazardous in different, but related, EU hazardous material legislation. Materials used in the EU need to registered under EU REACH legislation (Registration, Evaluation, Authorisation and Restriction of Chemicals) if classified as dangerous according to Directive 67/548/EEC and present in concentrations above specified concentration limits (Directive 1999/45/EC or in Annex I to Directive 67/548/EEC) or Annex VI of Legislation EC1272/2008).

Ten elements (specifically As, Be, Cd, Cr(VI), Hg, Pb, Sb, Se, Tl, U) are identified as "generically hazardous", with all compounds (including semiconductor compounds) considered as dangerous (human and/or animal carcinogens, toxicants or hazards to aquatic environments) apart from a limited number of exceptions. Eight of these elements (As, Be, Cd, Hg, Pb, Sb, Se, Tl) are also self-selecting as highly toxic in being the only elements where concentrations of 10 parts per billion or less are specified in drinking water standards issued by the World Health Organisation, the US Environmental Protection Agency or the European Union. Invoking the precautionary principle guiding present environmental legislation, these 10 elements might also be best avoided, along with the radioactive elements. For example, for thin film photovoltaics using CdTe can have issues relating to the toxicity of Cd which may cause problems once the devices degrade or need to be disposed. Similar problems can also be experienced for the other toxic elements currently used in semiconductors, such as Se or Pb.

Closed-shell adamantine semiconductor families can be deduced by selecting compounds that have equal numbers of cations and anions in the formula and 4 valence electrons/atom. Hence CdTe is adamantine and a member of the II-VI binary family. However, the II-VI family has a ternary subfamily, I-III-VI$_2$, of which the most famous member is CIGS (alloy of CuInSe$_2$ & CuGaSe$_2$), with this itself having a quaternary subfamily, I$_2$-II-IV-VI$_4$. CZTS is the most developed member of this family attracting considerable research attention since, unlike CdTe & CIGS, CZTS involves only non-toxic elements. However, CZTS semiconductors used in a photovoltaic cell generally have efficiencies presently much less than 20%. There is presently a dearth of adamantine semiconductors involving abundant, non-toxic elements that have given efficiencies over 20%, with the only example being silicon. Therefore, it may be advantageous to provide a semiconductor having only non-toxic elements. In some embodiments the semiconductor is substantially free from non-toxic elements including Cd.

The first element may have a zero oxidation state. For some of the elements from groups VII, VI, V, IV, III, II, I or 0 such as Ni, a zero oxidation valency state is uncommon except in the form of a pure crystal of that element. For example, Ni normally forms a 2+ oxidation state, with Ni(CO)$_4$ being a rare example of a zero oxidation state for Ni. Other elements such as Pd and Pt may be in their zero oxidation state. Providing the first element in its zero oxidation state may give rise to semiconductors with suitable properties for use in e.g. a solar cell element including a stacked solar cell element. The semiconductor may have a closed-shell structure with an equivalent number of cations and anions. Closed-shell adamantine semiconductors tend to be most suited for use as solar cell elements since all but one of the materials giving over 20% efficiency are closed-shell adamantine semiconductors. In some embodiments each anion is surrounded by a same combination of cations.

A bandgap of the semiconductor may range from about 0.6 eV to about 2.1 eV. The limiting efficiency of a solar cell consisting of a single material, in principle, generally depends only on its bandgap with materials having bandgaps between 0.8 eV and 1.8 eV capable of efficiency above 25%. However, defects in the material and its interfaces determine how closely such efficiencies are approached in practice. Constraints imposed by defects presently can only be determined experimentally. However, in some embodiments the semiconductor has a low-lying d-state giving rise to an anti-bonding valence band edge. The anti-bonding valence band edge may be especially prevalent, such as for elements including Ni. It is thought that these anti-bonding valence band edges make the material more tolerant to defects. Therefore, the limitations that apply to the efficiencies of conventional semiconductors used in photovoltaics may not apply to the disclosed adamantine semiconductors. A semiconductor having a bandgap from about 0.6 eV to about 2.1 eV and a low-lying d-state may be used to form a stacked solar cell element with an efficiency of >25%. In some embodiments the semiconductor is stacked onto silicon to form a stacked solar photovoltaic cell.

Figure 2:
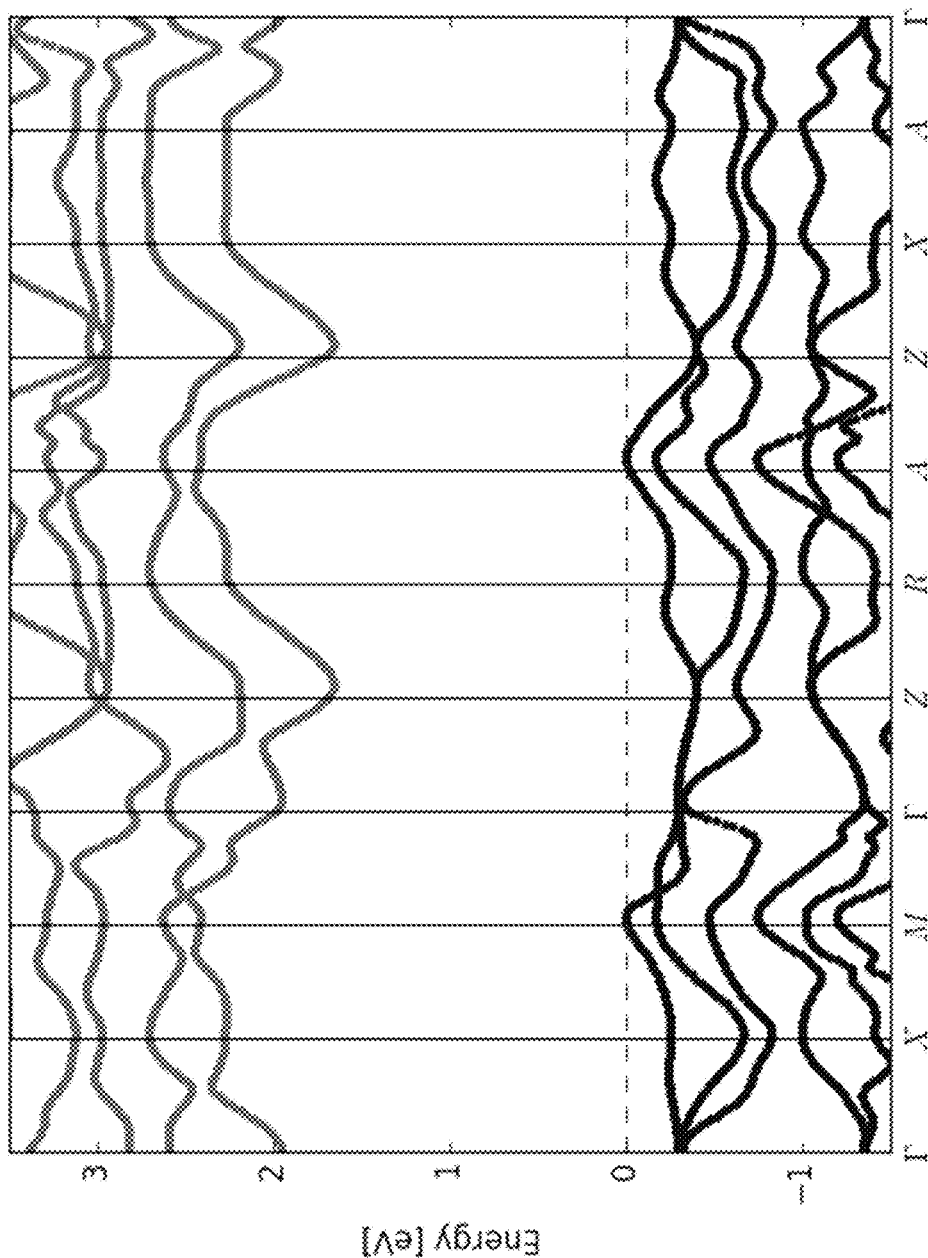
FIG. 2 shows band structure calculations for $CoZnAlSiS_4$.

Of the many elements that can be used to form a semiconductor having a structure of one or more of the families 0-II-VII$_2$, 0$_2$-III-VII$_3$, 0$_3$-IV-VII$_4$, 0-IV-VI$_2$, 0-III$_2$-VI$_3$, 0-IV$_3$-V$_4$, 0-I-II-VII$_3$, 0-I$_2$-II-VII$_4$, 0$_2$-I-III-VII$_4$, 0-I-V-VI$_3$, 0-II-IV-VI$_3$, 0-II-III$_2$-VI$_4$, 0-II$_2$-IV-VI$_4$, 0-I-II-V-VI$_4$ and/or 0-I-III-IV-VI$_4$, the elements Ni, Si, P, S, I, Br and Cl may be advantageous since these elements are abundant and non-toxic. The semiconductor may also include Se. In some embodiments the semiconductor is only formed from one or more of the elements Ni, Cu, Mg, Zn, Al, Si, Bi, P, S, I, Br, Cl and/or Se. In some embodiments, the semiconductor is formed from the elements including Ca, Sr, Ba, La, Ti, Zr, Hf, V, Nb, Ta, Cr, Mo, W, Mn, Fe, Co, Ni, Cu, Ag, Mg, Zn, B, Al, Ga, C, Si, Sn, N, P, Bi, O, S, F, Cl, Br and/or I. These elements may be advantageous since they are abundant and non-toxic. In one particular embodiment the semiconductor is formed from Ni, Si and S. For example, the semiconductor may have a formula of NiSiS$_2$ i.e. be part of the 0-IV-VI$_2$ family ternary adamantine semiconductor. NiSiS$_2$ may have a direct bandgap of 0.8 eV, as deduced by ab-initio computer simulation. In another embodiment, the semiconductor is formed from Ni, Si and P, and may have a formula of NiSi$_3$P$_4$ i.e. be part of the 0-IV$_3$-V$_4$ family. Such compositions provide a semiconductor that is made from non-toxic and abundant elements, and this may help to provide easily scalable and cost effective solar cell elements. FIGS. 1 and 2 show ab initio studies for a CoZnAlSiS$_4$ compound, as an example of a I-II-III-IV-VI$_4$, structure from the quinternary family. For CoZnAlSiS$_4$, Co has a formal −1 oxidation state and a bandgap of approximately 1.7 eV. CoZnAlSiS$_4$ is just one example of an adamantine semiconductor illustrated by the disclosure.

Also disclosed is a method of forming an adamantine semiconductor. The method comprises providing a mixture including a first element being from one of the following groups: VII, VI, V, IV, III, II, I or 0B; and at least two other elements, the at least two other elements being from group I, II, III, IV, V, VI and/or VII. The first element being from group VII, VI, V, IV, III, II, I or 0 includes an element not formally being from group VII, VI, V, IV, III, II, I or 0 but is known to assume the same oxidation state as the elements that do lie in these groups. The at least two other elements being from group I, II, III, IV, V, VI and/or VII includes elements not formally being from group I, II, III, IV, V, VI and/or VII but are known to assume the same oxidation state as the elements that do lie in these groups. The method also comprises annealing the mixture to form the semiconductor. The mixture may have an element from at least two of group I, II, III, IV, V, VI and/or VII.

The group 0B element may include Ni and the I, II, III, IV, V, VI and/or VII elements may include Cu, Mg, Zn, Al, Si, Bi, P, S, I, Br, Cl and/or Se. In some embodiments, the first element includes Ca, Sr, Ba, La, Ti, Zr, Hf, V, Nb, Ta, Cr, Mo, W, Mn, Fe, Co, Ni, and the at least two other elements includes Cu, Ag, Mg, Zn, B, Al, Ga, C, Si, Sn, N, P, Bi, O, S, F, Cl, Br and/or I. The first and the at least two other elements may be provided as a powder, gas, salt and/or solution. For example, when the resulting semiconductor is NiSiS$_2$, the elements Ni, Si and S may be provided in their powdered forms as pure metals or as their sulfides. When the elements e.g. Ni and Si are provided in their sulphide form, there may be no need to add addition S to form NiSiS$_2$. To ensure the elements are evenly disturbed in the mixture, the mixture may be homogenised prior to annealing. However, in some embodiments the elements migrate during annealing so that they are distributed according to the structure of the associated family. In some embodiments, metal layer deposition may be used to form the semiconductor. In some embodiments, metal layer deposition may be followed by sulfidisation to form the semiconductor, for example when the semiconductor comprises S.

The method may include providing a substrate onto which the mixture is applied to prior to annealing. Therefore, the semiconductor along with interfacial and contacting layers may be formed on a surface of a substrate. The substrate may be photovoltaically active. The substrate may comprise Si. The substrate may consist of Si. The semiconductor may be formed by sputtering pure metals or their sulphides onto a substrate, then heating in a S or Se environment. This process may be similar to the way CZTS semiconductors are formed.

By not including non-toxic elements, the method may be more cost effective and more widely used compared to methods that require the use of toxic elements such as Cd since disposal of toxic waste is not required. Using abundant elements may also help to reduce the feedstock costs of the method, for example when the first element and the at least two other elements have a natural abundance.

The disclosure also extends to an adamantine semiconductor formed using the method as set forth above. The semiconductor may be defined as set forth above.

Although the adamantine semiconductor has been described with reference to solar cell elements and the like, the disclosed adamantine semiconductor is not limited to this use and may be used in other applications that require the use of semiconductors. These are far-ranging applications and may include those that take advantage of the magnetic properties of the transition metals involved.

Embodiments of the disclosure are also directed to a photovoltaic element such as a device. The photovoltaic element in an embodiment comprises a substrate and necessary contacting, antireflective and interfacial layers. Embodiments may also comprise a first layer having an adamantine semiconductor comprising a first element being from one of the following groups: VII, VI, V, IV, III, II, I or 0; and at least two other elements, the at least two other elements being from group I, II, III, IV, V, VI and/or VII, wherein the first element being from group VII, VI, V, IV, III, II, I or 0 includes an element not formally being from group VII, VI, V, IV, III, II, I or 0 but is known to assume the same oxidation state as the elements that do lie in these groups; and wherein the at least two other elements from group I, II, III, IV, V, VI and/or VII includes elements not formally being from group I, II, III, IV, V, VI and/or VII but are known to assume the same oxidation state as the elements that do lie in these groups.

The adamantine semiconductor may be as set forth above. In the embodiments where the semiconductor has a low-lying d-state giving rise to an anti-bonding valence band edge, an efficiency of the photovoltaic device may be determined solely on the bandgap of the semiconductor rather than defects in the material since the anti-bonding valence band edge is thought to make the materials that are used to form the photovoltaic device be more tolerant to defects. In some embodiments an efficiency of the device in use is >25%, such as >35%.

Figure 3:
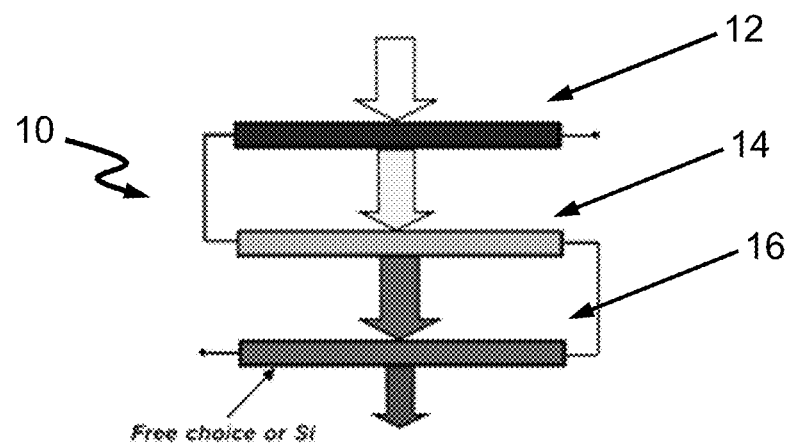
FIGS. 3 and 4 are schematic representations of tandem solar cell devices.

In some embodiments the device also comprises a second or more individual photovoltaic cells that are stacked on top of each other so that the photovoltaic element is a stacked device. For example, the photovoltaic device may have layers forming a stacked photovoltaic cell having two or three or more individual photovoltaic cells. The first and second or more photovoltaic cells may be arranged so that a bandgap of each layer decreases in a direction extending from a photo receiving surface (i.e. top surface) to the substrate. Put another way, the photovoltaic device may be arranged such that each of the first and second solar cells absorb a portion of the photons that are received by the photon receiving surface. FIG. 3 shows a schematic representation of a stacked photovoltaic device 10. A top structure e.g. top photovoltaic cell 12 of the device 10 has a first bandgap and absorbs energy from incoming photons. A middle structure e.g. middle photovoltaic cell 14 has a second bandgap less than the first bandgap of the top photovoltaic 12 so that the middle photovoltaic cell 14 can absorb photons that a longer wavelength relative to the wavelengths of the photons adsorbed by the top photovoltaic cell 12. A bottom structure e.g. bottom photovoltaic cell 16 has a bandgap less than that the bandgap of the middle photovoltaic cell 14 so that the bottom photovoltaic cell 16 can absorb photons having a lower energy (red-shifted relative to the wavelengths absorbed by the middle photovoltaic cell 14). The structure would include all the additional layers required to interconnect the cells and to couple light efficiently into the desired cells.

The substrate may be Si-based. The substrate may have an associated bandgap. For example, the substrate may be a first single homojunction silicon solar cell comprising two doped silicon portions with opposite polarities and having a first bandgap. Therefore, in some embodiments the substrate acts as the second or more layers. One of the second or more layers may be a solar cell that is configured similarly to a Passivated Emitter and Rear Locally-diffused (PERL) silicon solar cell. Alternatively, a Passivated Emitter and Rear Cell (PERC) cell may be used as one of the layers. Providing a stacked photovoltaic device may increase the efficiency of the device well beyond that possible from a single material. Going from a single silicon cell to a 2-cell stack on silicon may give a 47% (relative) boost in performance while going from a 2-cell to a 3-cell may give another 12% (relative) boost, or 64% overall relative boost.

The upper limit on the efficiency of a single silicon cell is 29%, slightly lower than the limit of 33% for a GaAs cell (a III-V compound semiconductor) since GaAs has a slightly higher bandgap and also slightly different carrier recombination dynamics. However, silicon becomes very close to the ideal material for 2- and 3-cell stacks, with the limiting efficiency approaching the maximum possible from the most idealised choice of semiconductor materials. A stacked device having the disclosed adamantine semiconductor may provide a photovoltaic device having even higher efficiencies as in some embodiments the semiconductor has a low-lying d-state giving rise to an anti-bonding valence band edge.

Figure 4:
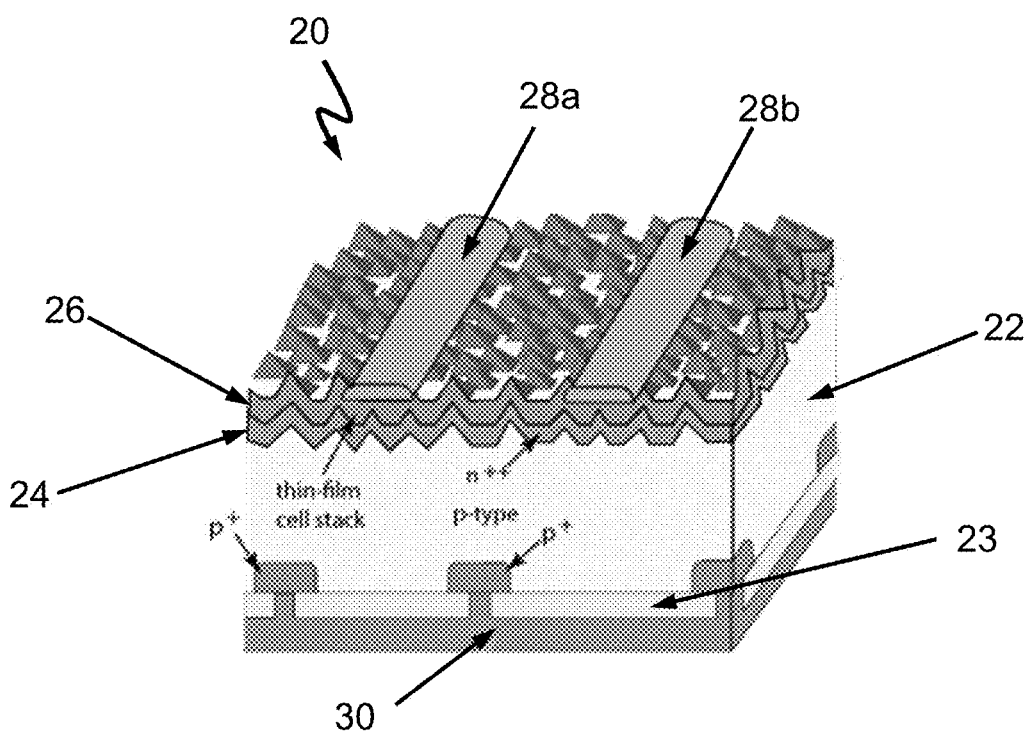

A schematic representation of a stacked photovoltaic device 20 is shown in FIG. 4. Device 20 has a Passivated Emitter and Rear Cell (PERC) solar cell 22. A dielectric passive layer 23 is sandwiched between a bottom surface of the cell 22 and a bottom metal contact 30. Layer 24 forms the diffused top junction of the cell 22. A second layer 26 is positioned above layer 24 with the necessary interfacial and contacting layers to make electrical contact to layer 24. A bandgap of the second layer 26 is higher than a bandgap of the first cell 22. In contact with the second layer 26 are first and second top metal contacts 28a and 28b. Each of the first and second metal contacts 28a and 28b has a width of about 20-80 µm, and a gap between the first top metal contact 28a and the second top metal contact 28b is about 2-5 mm. In the embodiment of FIG. 4, the cell 22 and diffused layer 24 can be considered as forming the substrate. However, since the cell 22 has a bandgap, the cell 22 can also be considered as forming a layer in the stack, so the device of FIG. 4 can be a two up to indefinite layer stack device. Layer 24 is part of the substrate. As well as the absorber layers in the stacked cells based on embodiments of the semiconductor of the disclosure, other layers are required to make photovoltaic device active and to allow contacting between cells.

When non-toxic and abundant elements are used to form the photovoltaic device, costs associated with disposing of toxic waste during repair and/or decommissioning the device may be avoided. Also, increasingly restrictive environmental legislation may specifically prevent use of the more toxic of these materials. This may not only help to reduce the costs associated with the photovoltaic devices, it may also help to reduce the environmental impact of the photovoltaic devices.

Another embodiment also provides a method of forming a photovoltaic device. The method comprises providing a substrate. The method also comprises depositing a first solar cell structure on the substrate, the first solar cell structure including an absorption region formed from an adamantine semiconductor comprising a first element being from one of the following groups: VII, VI, V, IV, III, II, I or 0; and at least two other elements, the at least two other elements being from group I, II, III, IV, V, VI and/or VII, wherein the first element being from group VII, VI, V, IV, III, II, I or 0 includes an element not formally being from group VII, VI, V, IV, III, II, I or 0 but is known to assume the same oxidation state as the elements that do lie in these groups; and wherein the at least two other elements from group I, II, III, IV, V, VI and/or VII includes elements not formally being from group I, II, III, IV, V, VI and/or VII but are known to assume the same oxidation state as the elements that do lie in these groups.

The adamantine semiconductor may be as set forth above. Because the adamantine semiconductor may comprise non-toxic and abundant elements, the costs of performing the method may be cheaper compared to conventional methods that require the use of toxic and non-abundant elements, such as Cd. By-products produced from the method may also be more readily disposed of since there should not be any hazardous waste that includes toxic elements.

The method may further comprise depositing a second or more solar cell structures to form a stacked solar cell. Each structure of the first and/or second or more solar cell structures may have a different bandgap. To extract as much energy out of each photon, the first and second or more solar cell structures may be deposited in such a way that a bandgap of each solar cell structure in the stack decreases in a direction extending from a photo receiving surface to the substrate. Such a structure may help to increase the efficiency of the photovoltaic device. In some embodiments, the substrate may be converted into a first single silicon homo-junction solar cell. Therefore, the substrate may form one of the second or more cell structures. The first and/or second or more cell structures may be deposited using similar methods to commercial thin-film cells, such as CdTe and CIGS cell structures. In some embodiments the adamantine semiconductor is formed using metal layer deposition. The adamantine semiconductor may be formed as set forth above.

An embodiment provides a photovoltaic device manufactured using the method as set forth above.

In the claims which follow and in the preceding description, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the semiconductors, methods and solar cells.

It will be understood to persons skilled in the art of the invention that many modifications may be made without departing from the spirit and scope of the invention.

The invention claimed is:

1. An adamantine semiconductor comprising:
   a first element being from one of the following groups: VIII, VII, VI, V, IV, III, II, I or 0; and
   at least two other elements, the at least two other elements being from at least one of:
   i) at least one of group I, II, III, IV, V, VI, or VII; or
   ii) elements that are not formally being from group I, II, III, IV, V, VI, or VII but have the same oxidation state as the elements that are from the at least one of group I, II, III, IV, V, VI, or VII,
   wherein the semiconductor has a closed-shell structure with equal numbers of cations and anions and an average of 4 valence electrons per atom, and wherein the adamantine semiconductor has a structure in accordance with a quaternary family being from one of $(0$-I-II-VII$_3)$, $(\bar{I}$-I-III-VII$_3)$, $(\bar{II}$-I-IV-VII$_3)$, $(\bar{III}$-I-V-VII$_3)$, $(\bar{IV}$-I-VI-VII$_3)$, $(\bar{II}$-II-III-VII$_3)$, $(\bar{III}$-II-IV-VII$_3)$, $(\bar{IV}$-II-V-VII$_3)$, $(\bar{IV}$-III-IV-VII$_3)$, $(\bar{V}$-II-VI-VII$_3)$, $(\bar{V}$-III-V-VII$_3)$, $(\bar{VI}$-III-VI-VII$_3)$, $(\bar{VI}$-IV-V-VII$_3)$, $(\bar{VII}$-IV-VI-VII$_3)$, $(\bar{VIII}$-V-VI-VII$_3)$, $0$-I$_2$-II-VII$_4$, $0_2$-I-III-VII$_4$, I-I$_2$-III-VII$_4$, I$_2$-I-V-VII$_4$, $\bar{I}$-I-II$_2$-VII$_4$, I$_2$-II-IV-VII$_4$, $\bar{II}$-I$_2$-IV-VII$_4$, $\bar{II}_2$-II-VI-VII$_4$, $\bar{II}_2$-III-V-VII$_4$, III-I$_2$-V-VII$_4$, $\bar{III}$-II$_2$-III-VII$_4$, $\bar{III}_2$-IV-VI-VII$_4$, $\bar{III}$-I-III$_2$-VII$_4$, $\bar{IV}$-I$_2$-VI-VII$_4$, $\bar{IV}$-II$_2$-IV-VII$_4$, $\bar{IV}$-II-III$_2$-VII$_4$, $\bar{V}$-II$_2$-V-VII$_4$, $\bar{V}$-I-IV$_2$-VII$_4$, $\bar{VI}$-III$_2$-IV-VII$_4$, $\bar{VI}$-II$_2$-VI-VII$_4$, $\bar{VII}$-I-V$_2$-VII$_4$, $\bar{VII}$-III-IV$_2$-VII$_4$, $\bar{VII}$-I-V$_2$-VII$_4$, $\bar{VIII}$-II-V$_2$-VII$_4$, $\bar{VIII}$-III$_2$-VI-VII$_4$, $(0$-I-V-VI$_3)$, $(0$-II-IV-VI$_3)$, $(\bar{I}$-III-IV-VI$_3)$, $(\bar{I}$-II-V-VI$_3)$, $(\bar{II}$-III-V-VI$_3)$, $(\bar{III}$-IV-V-VI$_3)$, $0$-II-III$_2$-VI$_4$, $0$-II$_2$-IV-VI$_4$, $\bar{I}$-II$_2$-V-VI$_4$, $\bar{I}$-I-IV$_2$-VI$_4$, $\bar{II}$-II-IV-VI$_4$, $\bar{II}$-III$_2$-IV-VI$_4$, $\bar{III}$-III-IV$_2$-VI$_4$, $\bar{III}$-III$_2$-V-VI$_4$, $\bar{VI}$-III-V$_2$-VI$_4$, $\bar{VI}$-IV-V$_2$-VI$_4$.

2. The semiconductor of claim 1, wherein the first element is selected from:
   calcium (Ca), strontium (Sr), barium (Ba), lanthanum (La); titanium (Ti), zirconium (Zr), hafnium (Hf), vanadium (V), niobium (Nb), tantalum (Ta), chromium (Cr), molybdenum (Mo), tungsten (W), manganese (Mn), iron (Fe), cobalt (Co), and nickel (Ni).

3. The semiconductor of claim 1; wherein the at least two other elements are selected from:
   copper (Cu), silver (Ag), magnesium (Mg), zinc (Zn), boron (B), aluminium (Al), gallium (Ga), carbon (C), silicon (Si), tin (Sn), nitrogen (N), phosphorus (P), bismuth (Bi), oxygen (O), sulfur (S), and fluorine (F), chlorine (Cl), bromine (Br), iodine (I).

4. The semiconductor of claim 1, wherein the first element has a zero oxidation state.

5. The semiconductor of claim 1, wherein each anion is surrounded by a same combination of cations.

6. The semiconductor of claim 1, wherein a bandgap of the semiconductor ranges from about 0.6 eV to about 2.1 eV.

7. The semiconductor of claim 1, having a low-lying d-state giving rise to an anti-bonding valence band edge.

8. The semiconductor of claim 1, wherein the semiconductor is substantially free from toxic elements including Cd, Pb or Hg.

9. A method of forming an adamantine semiconductor, comprising:
providing a mixture including:
a first element being from one of the following groups: VIII, VII, VI, V, IV, III, II, I or 0; and
at least two other elements, the at least two other elements being from at least one of:
i) at least one of group I, II, III, IV, V, VI, or VII; or
ii) elements that are not formally being from group I, II, III, IV, V, VI, or VII but have the same oxidation state as the elements that are from the at least one of group I, II, III, IV, V, VI, or
wherein the semiconductor has a closed-shell structure with equal numbers of cations and anions and an average of 4 valence electrons per atom;
the method further comprising annealing the mixture to form the semiconductor, and wherein the adamantine semiconductor has a structure in accordance with a quaternary family being from one of (0-I-II-VII$_3$), ($\overline{\text{I}}$-I-III-VII$_3$), ($\overline{\text{II}}$-I-IV-VII$_3$), ($\overline{\text{III}}$-I-V-VII$_3$), ($\overline{\text{IV}}$-I-VI-VII$_3$), ($\overline{\text{II}}$-II-III-VII$_3$), ($\overline{\text{III}}$-II-IV-VII$_3$), ($\overline{\text{IV}}$-II-V-VII$_3$), ($\overline{\text{IV}}$-III-IV-VII$_3$), ($\overline{\text{V}}$-II-VI-VII$_3$), ($\overline{\text{V}}$-III-V-VII$_3$), ($\overline{\text{VI}}$-III-VI-VII$_3$), ($\overline{\text{VI}}$-IV-V-VII$_3$), ($\overline{\text{VII}}$-IV-VI-VII$_3$), ($\overline{\text{VIII}}$-V-VI-VII$_3$), 0-I$_2$-II-VII$_4$, 0$_2$-I-III-VII$_4$, $\overline{\text{I}}$-I$_2$-III-VII$_4$, I$_2$-I-V-VII$_4$, $\overline{\text{I}}$-I-II$_2$-VII$_4$, I$_2$-II-IV-VII$_4$, $\overline{\text{II}}$-I$_2$-IV-VII$_4$, $\overline{\text{II}}$$_2$-II-VI-VII$_4$, $\overline{\text{II}}$$_2$-III-V-VII$_4$, $\overline{\text{III}}$-I$_2$-V-VII$_4$, $\overline{\text{III}}$$_2$-II-III-VII$_4$, $\overline{\text{III}}$$_2$-IV-VI-VII$_4$, $\overline{\text{III}}$-I-III$_2$-VII$_4$, $\overline{\text{IV}}$-I$_2$-VI-VII$_4$, $\overline{\text{IV}}$-II-IV-VII$_4$, $\overline{\text{IV}}$-II-III$_2$-VII$_4$, $\overline{\text{V}}$-II$_2$-V-VII$_4$, $\overline{\text{V}}$-I-IV$_2$-VII$_4$, $\overline{\text{VI}}$-III$_2$-IV-VII$_4$, $\overline{\text{VI}}$-II$_2$-VI-VII$_4$, $\overline{\text{VII}}$-I-V$_2$-VII$_4$, $\overline{\text{VII}}$-III-IV$_2$-VII$_4$, $\overline{\text{VII}}$-I-V$_2$-VII$_4$, $\overline{\text{VIII}}$-II-V$_2$-VII$_4$, $\overline{\text{VIII}}$-III$_2$-VI-VII$_4$, (0-I-V-VI$_3$), (0-II-IV-VI$_3$), ($\overline{\text{I}}$-III-IV-VI$_3$), ($\overline{\text{I}}$-II-V-VI$_3$), ($\overline{\text{II}}$-III-V-VI$_3$), ($\overline{\text{III}}$-IV-V-VI$_3$), 0-II-III$_2$-VI$_4$, 0-II$_2$-IV-VI$_4$, $\overline{\text{I}}$-II$_2$-V-VI$_4$, $\overline{\text{I}}$-I-IV$_2$-VI$_4$, $\overline{\text{II}}$-II-IV-VI$_4$, $\overline{\text{II}}$-III$_2$-IV-VI$_4$, $\overline{\text{III}}$-III-IV$_2$-VI$_4$, $\overline{\text{III}}$-III$_2$-V-VI$_4$, $\overline{\text{VI}}$-III-V$_2$-VI$_4$, $\overline{\text{VI}}$-IV-V$_2$-VI$_4$.

10. The method of claim 9, wherein the first element and the at least two other elements are each provided as a powder, gas, salt, solution, or any combination thereof.

11. A photovoltaic element comprising:
a substrate; and
a first layer having an adamantine semiconductor comprising:
a first element being from one of the following groups: VIII, VII, VI, V, IV, III, II, I or 0; and
at least two other elements, the at least two other elements being from at least one of:
i) at least one of group I, II, III, IV, V, VI, or VII; or
ii) elements that are not formally being from group I, II, III, IV, V, VI, or VII but have the same oxidation state as the elements that are from the at least one of group I, II, III, IV, V, VI, or VII,
wherein the semiconductor has a closed-shell structure with equal numbers of cations and anions and an average of 4 valence electrons per atom, and
wherein the adamantine semiconductor has a structure in accordance with quaternary family being from one of (0-I-II-VII$_3$), ($\overline{\text{I}}$-I-III-VII$_3$), ($\overline{\text{II}}$-I-IV-VII$_3$), ($\overline{\text{III}}$-I-V-VII$_3$), ($\overline{\text{IV}}$-I-VI-VII$_3$), ($\overline{\text{II}}$-II-III-VII$_3$), ($\overline{\text{III}}$-II-IV-VII$_3$), ($\overline{\text{IV}}$-II-V-VII$_3$), ($\overline{\text{IV}}$-III-IV-VII$_3$), ($\overline{\text{V}}$-II-VI-VII$_3$), ($\overline{\text{V}}$-III-V-VII$_3$), ($\overline{\text{VI}}$-III-VI-VII$_3$), ($\overline{\text{VI}}$-IV-V-VII$_3$), ($\overline{\text{VII}}$-IV-VI-VII$_3$), ($\overline{\text{VIII}}$-V-VI-VII$_3$), 0-I$_2$-II-VII$_4$, 0$_2$-I-III-VII$_4$, $\overline{\text{I}}$-I$_2$-III-VII$_4$, I$_2$-I-V-VII$_4$, $\overline{\text{I}}$-I-II$_2$-VII$_4$, I$_2$-II-IV-VII$_4$, $\overline{\text{II}}$-I$_2$-IV-VII$_4$, $\overline{\text{II}}$$_2$-II-VI-VII$_4$, $\overline{\text{II}}$$_2$-III-V-VII$_4$, $\overline{\text{III}}$-I$_2$-V-VII$_4$, $\overline{\text{III}}$$_2$-II-III-VII$_4$, $\overline{\text{III}}$$_2$-IV-VI-VII$_4$, $\overline{\text{III}}$-I-III$_2$-VII$_4$, $\overline{\text{IV}}$-I$_2$-VI-VII$_4$, $\overline{\text{IV}}$-II$_2$-IV-VII$_4$, $\overline{\text{IV}}$-II-III$_2$-VII$_4$, $\overline{\text{V}}$-II$_2$-V-VII$_4$, $\overline{\text{V}}$-I-IV$_2$-VII$_4$, $\overline{\text{VI}}$-III$_2$-IV-VII$_4$, $\overline{\text{VI}}$-II$_2$-VI-VII$_4$, $\overline{\text{VII}}$-I-V$_2$-VII$_4$, $\overline{\text{VII}}$-III-IV$_2$-VII$_4$, $\overline{\text{VII}}$-I-V$_2$-VII$_4$, $\overline{\text{VIII}}$-II-V$_2$-VII$_4$, $\overline{\text{VIII}}$-III$_2$-VI-VII$_4$, (0-I-V-VI$_3$), (0-II-IV-VI$_3$), ($\overline{\text{I}}$-III-IV-VI$_3$), ($\overline{\text{I}}$-II-V-VI$_3$), ($\overline{\text{II}}$-III-V-VI$_3$), ($\overline{\text{III}}$-IV-V-VI$_3$), 0-II-III$_2$-VI$_4$, 0-II$_2$-IV-VI$_4$, $\overline{\text{I}}$-II$_2$-V-VI$_4$, $\overline{\text{I}}$-I-IV$_2$-VI$_4$, $\overline{\text{II}}$-II-IV-VI$_4$, $\overline{\text{II}}$-III$_2$-IV-VI$_4$, $\overline{\text{III}}$-III-IV$_2$-VI$_4$, $\overline{\text{III}}$-III$_2$-V-VI$_4$, $\overline{\text{VI}}$-III-V$_2$-VI$_4$, $\overline{\text{VI}}$-IV-V$_2$-VI$_4$.

12. The photovoltaic element of claim 11, further comprising a second or more layers so that the photovoltaic element is a stacked element.

13. The photovoltaic element of claim 12, wherein the first and second or more layers are arranged so that a bandgap of each layer decreases in a direction extending from a photo receiving surface to the substrate.

14. The photovoltaic element of claim 11, wherein an efficiency of the photovoltaic element in use is >25%.

15. The photovoltaic element of claim 14, wherein the efficiency is >35%.

* * * * *